US011565351B2

(12) United States Patent
Suzuki et al.

(10) Patent No.: US 11,565,351 B2
(45) Date of Patent: Jan. 31, 2023

(54) SUBSTRATE PROCESSING APPARATUS AND SUBSTRATE PROCESSING METHOD

(71) Applicant: SAMSUNG DISPLAY CO., LTD., Yongin-si (KR)

(72) Inventors: Toshinaru Suzuki, Yongin-si (KR); Dokyun Kwon, Seoul (KR); Jaebum Pahk, Seoul (KR); Jinwon Baek, Hwaseong-si (KR); Jeongho Yi, Suwon-si (KR); Jinpyung Lee, Pohang-si (KR); Kyongho Hong, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 950 days.

(21) Appl. No.: 16/375,582

(22) Filed: Apr. 4, 2019

(65) Prior Publication Data
US 2019/0308276 A1 Oct. 10, 2019

(30) Foreign Application Priority Data
Apr. 9, 2018 (KR) .................. 10-2018-0041019

(51) Int. Cl.
B23K 26/36 (2014.01)
B23K 26/38 (2014.01)
H01L 21/687 (2006.01)
B23K 26/70 (2014.01)

(52) U.S. Cl.
CPC ............ B23K 26/38 (2013.01); B23K 26/702 (2015.10); H01L 21/68778 (2013.01); H01L 21/68785 (2013.01)

(58) Field of Classification Search
CPC combination set(s) only.
See application file for complete search history.

(56) References Cited

U.S. PATENT DOCUMENTS

| 5,681,638 A | * | 10/1997 | Korenaga | ............. H01L 21/682 269/97 |
| 7,052,976 B2 | * | 5/2006 | Liu | ......... B28D 1/221 438/960 |
| 7,326,878 B2 | | 2/2008 | Odanaka et al. | |
| 8,969,756 B2 | | 3/2015 | Dougherty | |
| 2006/0027886 A1 | * | 2/2006 | Liu | ...... B23K 26/364 257/414 |
| 2010/0102044 A1 | | 4/2010 | Takizawa et al. | |
| 2011/0318906 A1 | * | 12/2011 | Chida | ................. H01L 21/6838 257/E21.237 |

(Continued)

FOREIGN PATENT DOCUMENTS

| JP | H05185266 | 7/1993 |
| JP | H09271980 | 10/1997 |

(Continued)

*Primary Examiner* — Michael A LaFlame, Jr.
(74) *Attorney, Agent, or Firm* — F. Chau & Associates, LLC

(57) ABSTRACT

A substrate processing apparatus includes the following: a support frame, first stage, a suction part, and a plurality of island-type second stages. The support frame is disposed on the first stage. The height of the support frame is lower than the height of the first stage. A plurality of island-type second stages are disposed on the support frame on the same plane as the first stage. The suction part is disposed on the support frame.

20 Claims, 15 Drawing Sheets

(56) References Cited

U.S. PATENT DOCUMENTS

2017/0138984 A1\* 5/2017 Noguchi ........... H01L 21/68757
2017/0263461 A1\* 9/2017 Matsubara ........ H01L 21/30655
2017/0345781 A1\* 11/2017 Harikai ............. H01L 21/32136
2019/0247954 A1 8/2019 Pahk et al.

FOREIGN PATENT DOCUMENTS

| JP | JP2002035984 | 2/2002 |
|---|---|---|
| JP | 2004001043 | 1/2004 |
| JP | 4580444 | 11/2010 |
| JP | 4993886 | 8/2012 |
| JP | 5587595 | 9/2014 |
| JP | 5824998 | 12/2015 |
| KR | 10-2010-0046800 | 5/2010 |
| KR | 10-1024086 | 3/2011 |
| KR | 1020110062886 | 6/2011 |
| KR | 10-1485062 | 1/2015 |
| KR | 10-1552562 | 9/2015 |
| KR | 10-2019-0043190 | 4/2019 |
| KR | 10-2019-0098875 | 8/2019 |

\* cited by examiner

SUBSTRATE PROCESSING APPARATUS AND SUBSTRATE PROCESSING METHOD

CROSS-REFERENCE TO RELATED APPLICATIONS

This U.S. non-provisional patent application claims priority under 35 U.S.C. § 119 to Korean Patent Application No. 10-2018-0041019, filed on Apr. 9, 2018, the disclosure of which is hereby incorporated by reference.

TECHNICAL FIELD

The disclosure herein relates to substrate processing, and more particularly, to a substrate processing apparatus and a substrate processing method.

Discussion of Related Art

In general, substrates on which a plurality of pixels are disposed are used in display devices. Each substrate is cut to be used in a form suitable for each particular display device. A substrate processing apparatus is utilized to cut the substrate accordingly. The substrate processing apparatus includes a stage on which the substrate is disposed and a laser unit for cutting the substrate into a desired shape.

When the substrate is irradiated, fumes may be generated in the process. These fumes may contain contamination particles which are generated on both the upper and lower surfaces of the substrate at the same time. Contamination particles contained in the fumes may be adsorbed onto the substrate. When the contamination particles are adsorbed onto the substrate, it is difficult to perform a subsequent process of forming pixels on the substrate due to the interference of the contamination. For example, when the contamination particles are adsorbed onto the substrate during this process, the substrate may be defective.

SUMMARY

Exemplary embodiments of the present inventive concept relate to a substrate processing apparatus and a substrate processing method which can prevent substrate contamination.

According to an exemplary embodiment of the inventive concept, a substrate processing apparatus includes a support frame, first stage, a suction part, and a plurality of island-type second stages. The support frame is disposed on the first stage. The height of the support frame is lower than the height of the first stage. A plurality of island-type second stages are disposed on the support frame on the same plane as the first stage. The suction part is disposed on the support frame.

According to an exemplary embodiment of the inventive concept, a substrate processing apparatus includes a first stage surrounded by a second stage. A first opening part is defined between the first and second stages. The second stage is surrounded by a support frame. A second opening part is defined between the second stage and the support frame. The support frame extends towards a lower side of the second stage. The side of the support frame extending towards a lower side of the second stage faces a side of the first stage with a space existing between the two defining the first passage. The first passage further connects to the surface by the first opening part. The second opening part connects to a second passage, which is defined as the space that exists between the second stage and the portion of the support frame that extends below the second stage. All the aforementioned passages and opening parts may be integrated. A suction part is disposed on both the second stage and the support frame.

According to an exemplary embodiment of the inventive concept, a method of processing a substrate includes preparing a first stage surrounded by a support frame with a second opening part defined between the two. The first stage is also surrounded by a second stage between which a first opening part is defined. The support frame extends towards a lower side of the second stage. The lower portion of the support frame faces a side of the first stage with a space between the two defining the first passage. The side of the first stage is curved toward the inside of the first stage. The first passage further connects to the surface by the first opening part. The second opening part connects to a second passage, which is defined as the space between the second stage and the portion of the support frame disposed below the second stage. All the aforementioned passages and opening parts may be integrated. A suction part is disposed on the surface of both the second stage and the support frame. The suction hole is adjacent to the second opening part. A substrate is disposed across the first and second stage boundary for laser irradiation which generates contamination particles. Subsequent to the irradiation process, contamination particles are suctioned into the suction part. The contamination particles generated from a lower portion of the substrate egress through the integrated passages and opening parts into the suction part. When the contamination particles are suctioned into the suction part, a pressure of a lower side of the substrate is less than that which exists on an upper side of the substrate at the first opening part.

BRIEF DESCRIPTION OF THE FIGURES

The above and other features of the present inventive concept will become more apparent by describing in detail exemplary embodiments thereof with reference to the included drawings. The drawings illustrate exemplary embodiments of the inventive concept and, together with the description, serve to explain principles of the inventive concept. In the drawings.

DETAILED DESCRIPTION

Figure 1:
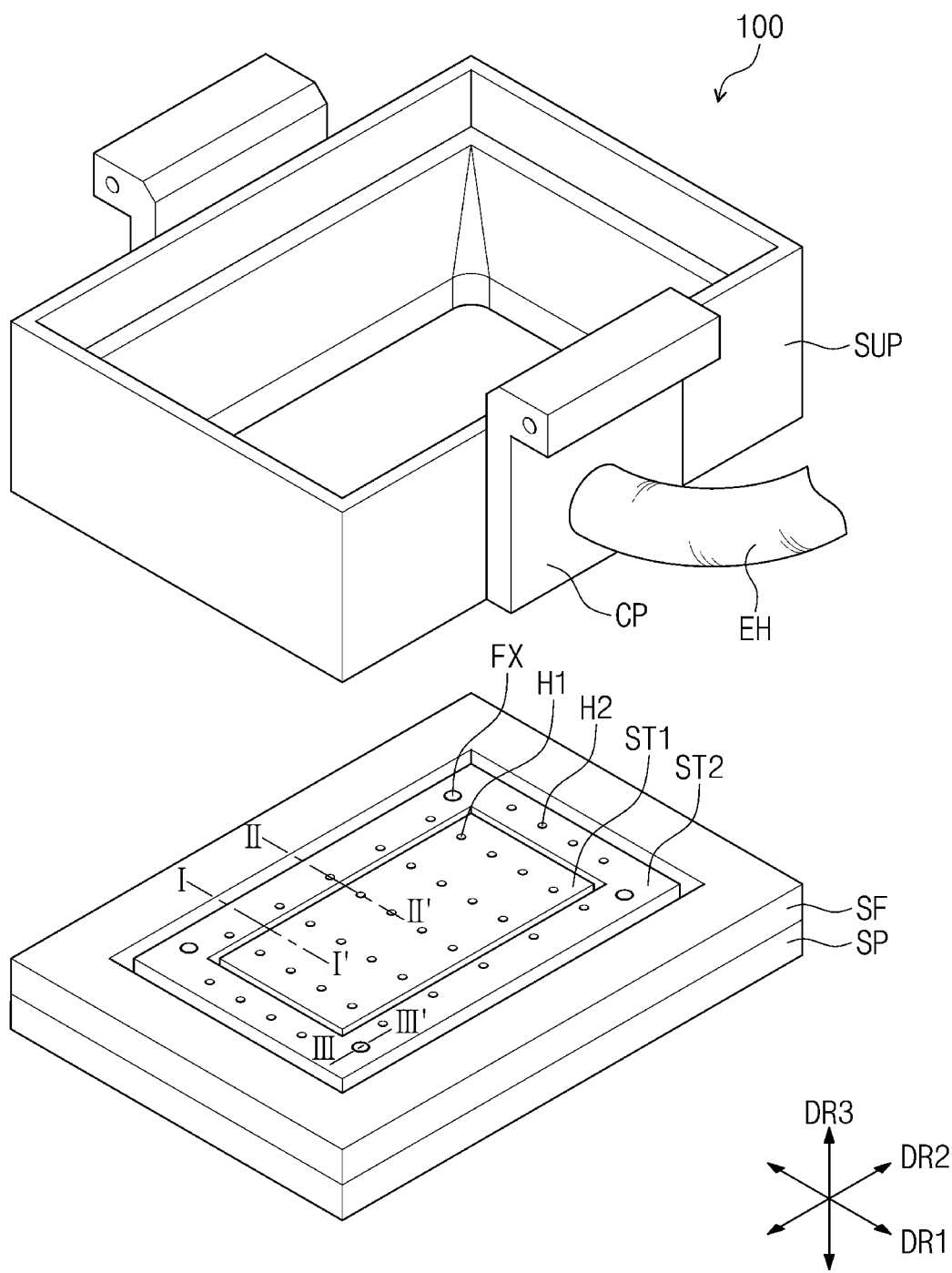
FIG. 1 is a perspective view illustrating a substrate processing apparatus according to an exemplary embodiment of the inventive concept.

Aspects and features of the present invention, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the inventive concept to those skilled in the art. Like reference numerals may refer to like elements throughout the application and figures.

It will also be understood that when a layer is referred to as being "on" another layer or substrate, it can be directly on the other layer or substrate, or intervening layers may also be present.

Spatially relative terms, such as "below", "beneath", "lower", "above", "upper" and the like, may be used herein for ease of description to describe one element or feature's relationship to another element(s) or feature(s) as illustrated in the figures. The spatially relative terms should be understood as terms which include different directions of configurative elements in addition to directions illustrated in the figures when using or operating the inventive concept.

It will be understood that although the terms of first and second are used herein to describe various elements and/or sections, these elements and/or sections should not be limited by these terms. These terms are only used to distinguish one element, component, or section from another element, component, or section. Accordingly, a first element, a first component, or a first section that will be described below may be a second element, a second component, or a second section within the technical idea of the present disclosure.

The embodiment in the detailed description will be described with schematic cross-sectional views and/or plan views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate a specific shape of a semiconductor package region. Thus, this should not be construed as limited to the scope of the inventive concept.

Hereinafter, exemplary embodiments of the inventive concept will be described below in more detail with reference to the accompanying drawings.

FIG. 1 is a perspective view illustrating a substrate processing apparatus according to an exemplary embodiment of the inventive concept.

Referring to FIG. 1, a substrate processing apparatus according to an exemplary embodiment of the inventive concept may include a first stage ST1, a second stage ST2, a support frame SF, a support part SP, a suction part SUP, exhaust parts EH, and connection parts CP.

The second stage ST2 may at least partially surround the first stage ST1, and the support frame SF may at least partially surround the second stage ST2. The second stage ST2 may be spaced a predetermined distance from the first stage ST1 forming a second opening part and the support frame SF may be spaced a predetermined distance from the second stage ST2 forming a first opening part OP1.

For example, the first stage ST1 may have a rectangular shape having a pair of short sides extending primarily in a first direction DR1 and a pair of long sides extending primarily in a second direction DR2 intersecting the first direction DR1. Hereinafter, a direction intersecting a plane defined by the first and second directions DR1 and DR2 is defined as a third direction DR3. The third direction DR3 may extend from the plane defined by the first and second directions DR1 and DR2 intersection in a substantially perpendicular direction.

The second stage ST2 may have a frame shape. The support frame SF may have a frame shape and includes a portion that extends below the lower surface of the second stage ST2. An exemplary configuration of the support frame SF will be described in detail with reference to FIG. 2.

A plurality of first holes H1 may be defined on the first stage ST1, and a plurality of second holes H2 may be defined on the second stage ST2. A plurality of fixing units FX may be disposed on the second stage ST2 to secure the second stage to the support frame. Exemplary configurations of the first and second holes H1 and H2 and the fixing units FX will be described in detail with reference to FIGS. 3 and 4.

The suction part SUP may be disposed on the second stage ST2 and the support frame SF. The connection parts CP may be disposed outside of the suction part SUP. For example, the suction part SUP may have a frame shape, and two connection parts CP may be disposed outside of the suction part SUP. The exhaust parts EH may be connected to the suction part SUP through the connection parts CP. The connection parts CP are optional and may be omitted. In this case, the exhaust parts EH may be directly connected to the suction part SUP.

When the substrate is disposed on the first and second stages ST1 and ST2 and then processed, the suction part SUP may suction away contamination particles generated from the substrate. The contamination particles suctioned through the suction part SUP may be collected into a duct collection part through the exhaust parts EH and then discharged to the outside.

Figure 2:
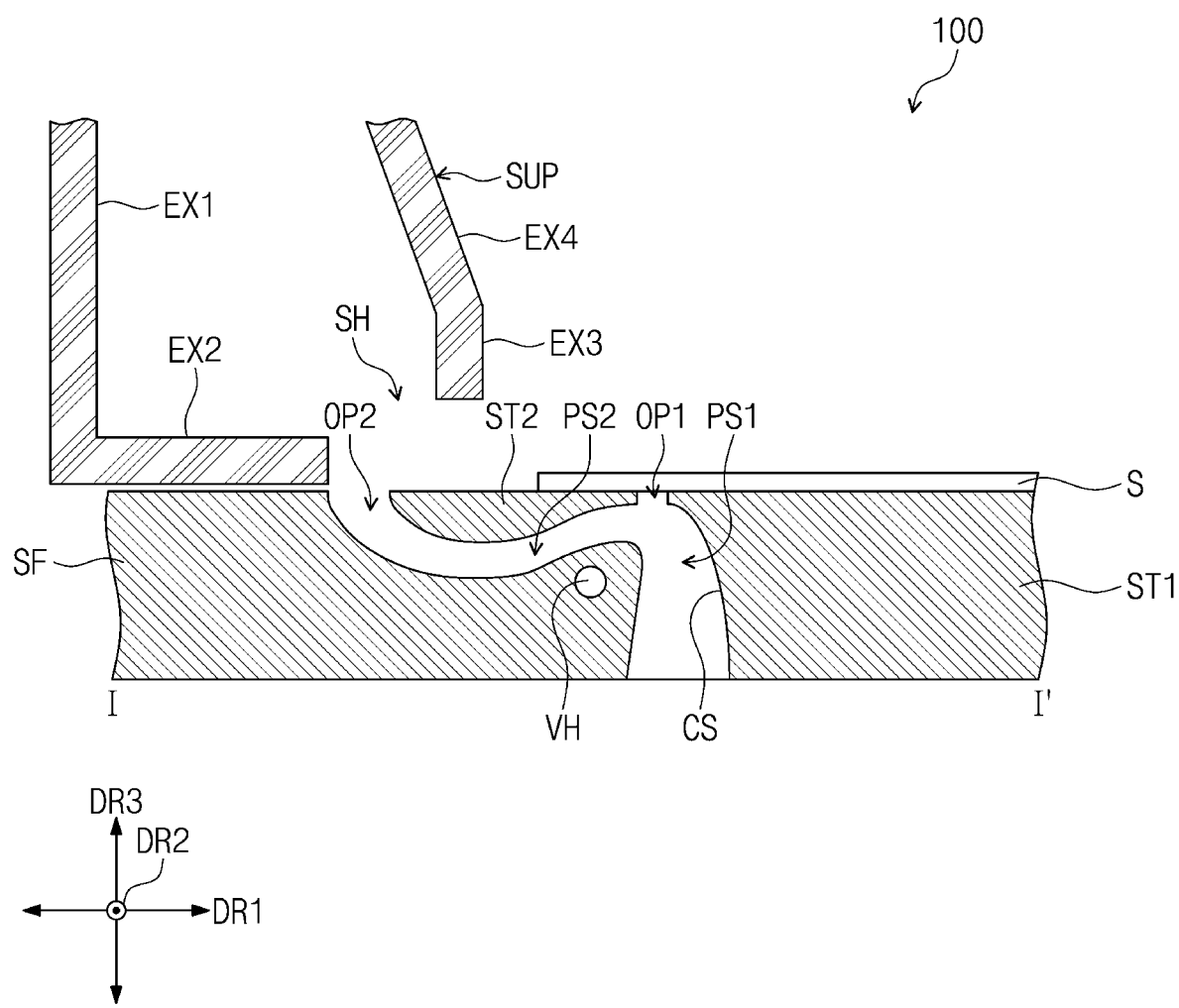
FIG. 2 is a cross-sectional view taken along line I-I' of FIG. 1.
Figure 3:
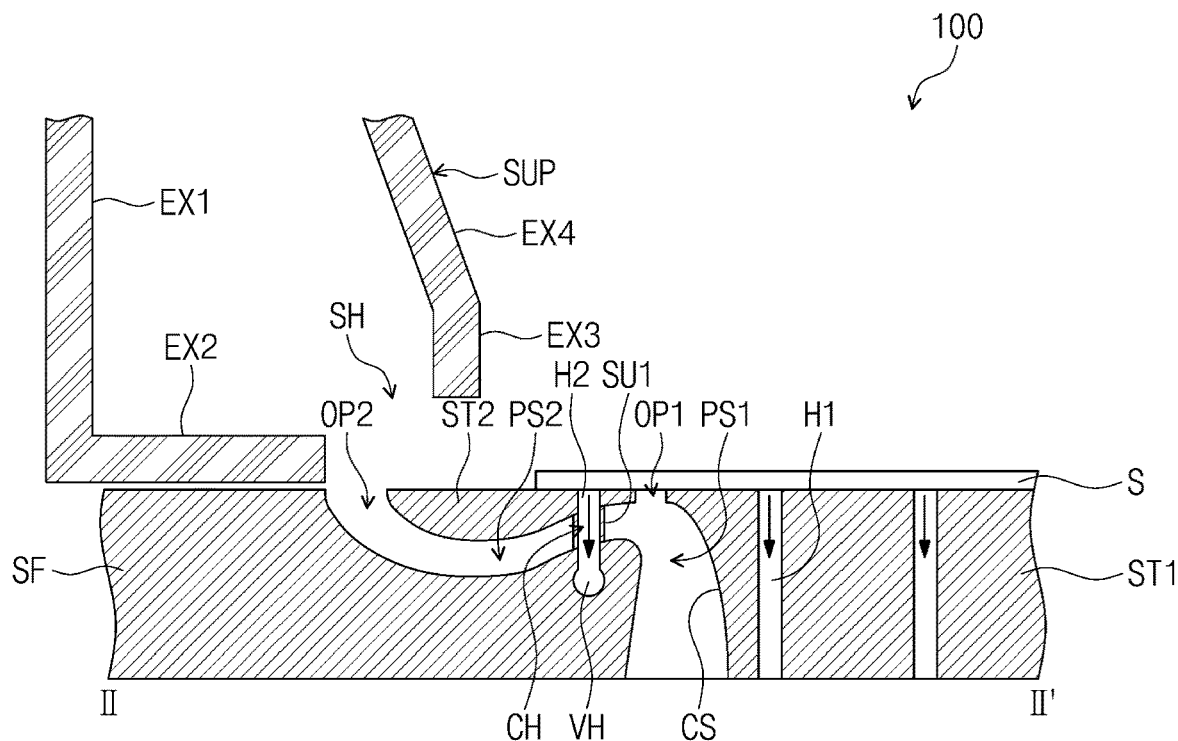
FIG. 3 is a cross-sectional view taken along line II-II' of FIG. 1.
Figure 4:
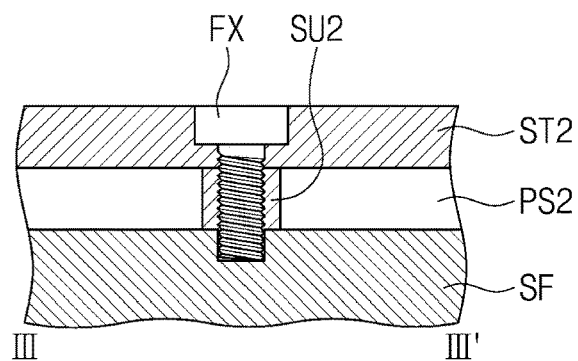
FIG. 4 is a cross-sectional view taken along line III-III' of FIG. 1.

FIG. 2 is a cross-sectional view taken along line I-I' of FIG. 1. FIG. 3 is a cross-sectional view taken along line II-II' of FIG. 1. FIG. 4 is a cross-sectional view taken along line III-III' of FIG. 1.

For convenience of description, a cross-section of the suction part is illustrated in FIGS. 2 and 3, and the support part SP is omitted.

Referring to FIG. 2, the support frame SF may at least partially surround the second stage ST2 and may have a portion that extends below a lower surface of the second stage ST2. The suction part SUP may be disposed on the second stage ST2 and the support frame SF.

A first passage PS1 may be defined as a first gap between one side of the support frame SF disposed below the lower surface of the second stage ST2 and one side of the first stage ST1, which faces the one side of the support frame SF. The one side of the first stage ST1 may have a curved surface CS that is recessed towards the inside of the first stage ST1.

A second passage PS2 may be defined between a lower surface of the second stage ST2 and the support frame SF disposed below the lower surface of the second stage ST2. The second passage PS2 may integrate with the second opening part OP2. The first passage PS1 may be connected to the first opening part OP1, the first opening part OP1 may itself be connected to the second passage PS2, and the second passage PS2 may be further connected to the second opening part OP2. For example, the first passage PS1, the first opening part OP1, the second passage PS2, and the second opening part OP2 may all be defined as a singular integrated space. The cavity formed by the suction part SUP forms a suction hole SH which may be disposed over the second opening part OP2.

A vacuum hole VH may be defined in a predetermined portion of the support frame SF which extends below the lower surface of the second stage. As an example of where the vacuum hole VH may be situated, the vacuum hole VH may be nearer to a top surface of the support frame SF than a bottom surface of the support frame SF. The first stage ST1 may have a height greater than that of the second stage ST2 in the third direction DR3. The third direction DR3 may be defined as a direction that is substantially perpendicular to a top surfaces of the first and second stages ST1 and ST2 and the support frame SF. The top surface of each of the first and second states ST1 and ST2, and the support frame SF may be defined as a plane that is substantially parallel to the first and second directions DR1 and DR2.

The top surface of the support frame SF disposed below the second stage ST2 may have a shape that is recessed downward. The bottom surface of the second stage ST2 may have a shape that protrudes downward. However, the embodiment of the inventive concept is not limited thereto. In an exemplary embodiment of the present inventive concept, the top surface of the support frame SF disposed below the second stage ST2 and the bottom surface of the second stage ST2 may be substantially parallel to one another.

Although not shown in FIG. 2, a support part SP may be disposed to surround lower surfaces of the first stage ST1 and the support frame SF to provide support for the first stage ST1 and the support frame SF.

The suction part SUP may include a first extension part EX1, a second extension part EX2, a third extension part EX3, and a fourth extension part EX4. The first extension part EX1 may be disposed on the support frame SF to extend substantially in the third direction DR3. The second extension part EX2 may extend from a lower end of the first extension part EX1 substantially in the DR1 direction.

The third extension part EX3 may be disposed on the second stage ST2 and may define the suction hole SH together with the second extension part EX2. For example, the suction hole SH may be defined between the second extension part EX2 and the third extension part EX3. The third extension part EX3 may extend substantially in the third direction DR3. A lower end of the third extension part EX3 may be disposed at a height greater than that of the second extension part EX2 overlying the support frame. Thus, a space between the third extension EX3 and the second stage ST2 may be larger than a space between the second extension part EX2 and the upper surface of the support frame SF disposed beneath the second extension part EX2.

The fourth extension part EX4 extends from the third extension part EX3 in substantially the DR3 direction. The fourth extension part EX4 may extend towards the first extension part EX1 at a predetermined angle.

The substrate S may be disposed across the first stage ST1 and the second stage ST2.

Referring to FIG. 3, the substrate S may be disposed on the first and second stages ST1 and ST2 to overlap the first holes H1 defined in the first stage ST1 and the second holes H2 defined in the second stage ST2.

The first and second holes H1 and H2 may provide predetermined adsorption force to the substrate S fixing the substrate S to the first and second stages ST1 and ST2. For example, when air within the first and second holes H1 and H2 externally discharged, the first and second holes H1 and H2 are induced into a vacuum state. The substrate S may be affixed to the first and second stages ST1 and ST2 by the adsorption force generated through the first and second holes H1 and H2 in a vacuum state.

As illustrated in the exemplary embodiment depicted in FIG. 1, the holes H1 may be arranged in the form of a matrix, but the arrangement of the first holes H1 is not limited thereto. The second holes H2 may be adjacent to one side of the second stage ST2. A plurality of first support units SU1 may be disposed between the second stage ST2 and the support frame SF region disposed below the second stage ST2 to support the second stage ST2. In an exemplary embodiment, the first support units SU1 may be integrated with the second holes H2.

The connection holes CH connecting the second holes H2 to the vacuum hole VH may be defined in the first support units SU1 and the support frame SF. The connection holes CH may be integrated with the second holes H2. Air may be externally discharged through the vacuum hole VH to allow the second holes H2 to be maintained in the vacuum state. A vacuum hole connected to the first holes H1 to maintain the vacuum state of the first holes H1 may be defined in the support part SP.

When a portion of the substrate S overlapping the first opening part OP1 between the first stage ST1 and the second stage ST2 is processed by laser radiation, contamination particles may be generated at both the upper and lower surfaces of the substrate at substantially the same time. The contamination particles may be suctioned away into the suction part SUP through the suction hole SH and then externally discharged to prevent contamination particles from adsorbing to the substrate. The discharging operation of the contamination particles will be described in detail with reference to FIGS. 5 and 6.

Figure 5:
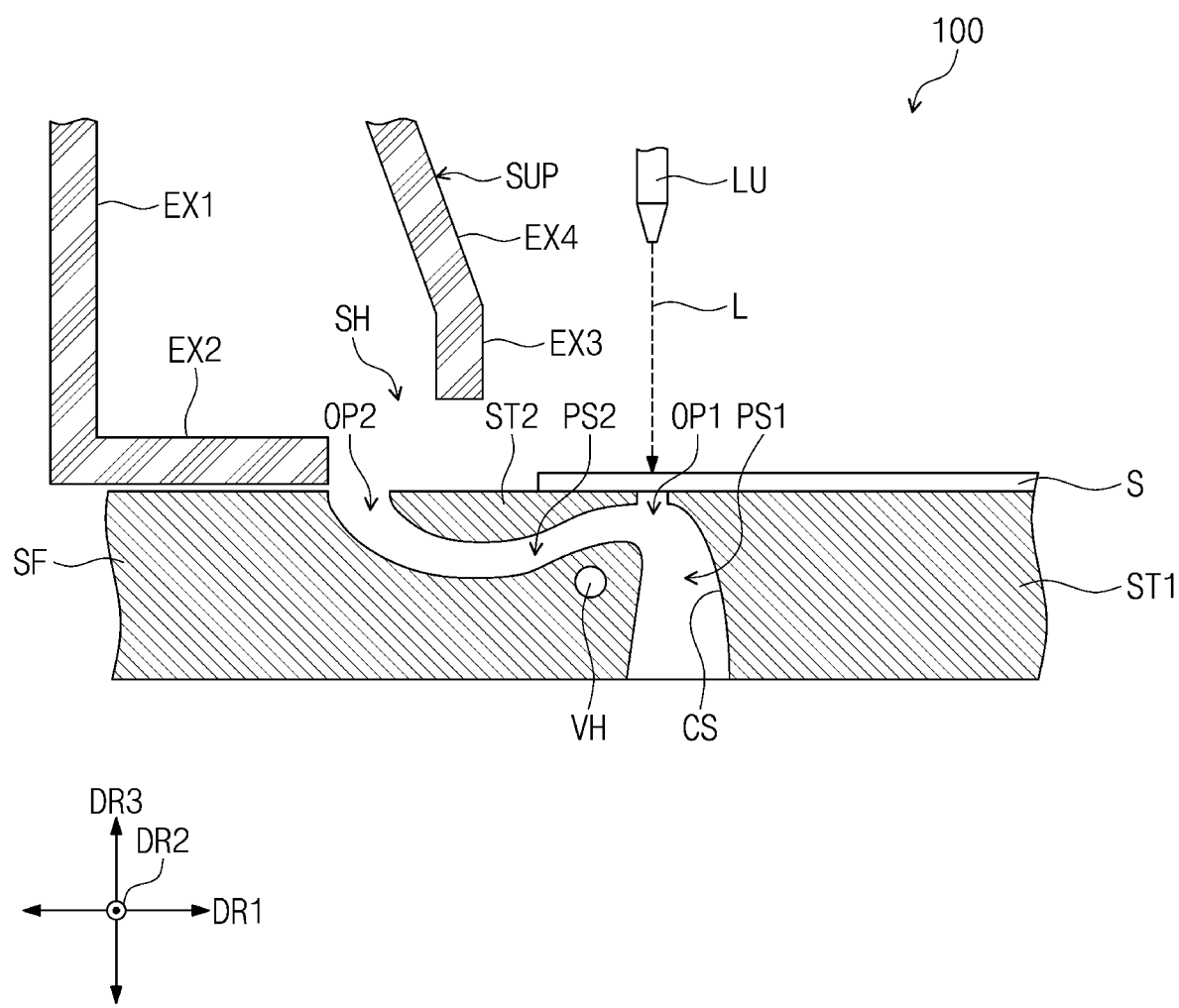
FIGS. 5 and 6 are views illustrating a substrate processing method using the substrate processing apparatus of FIG. 1.
Figure 6:
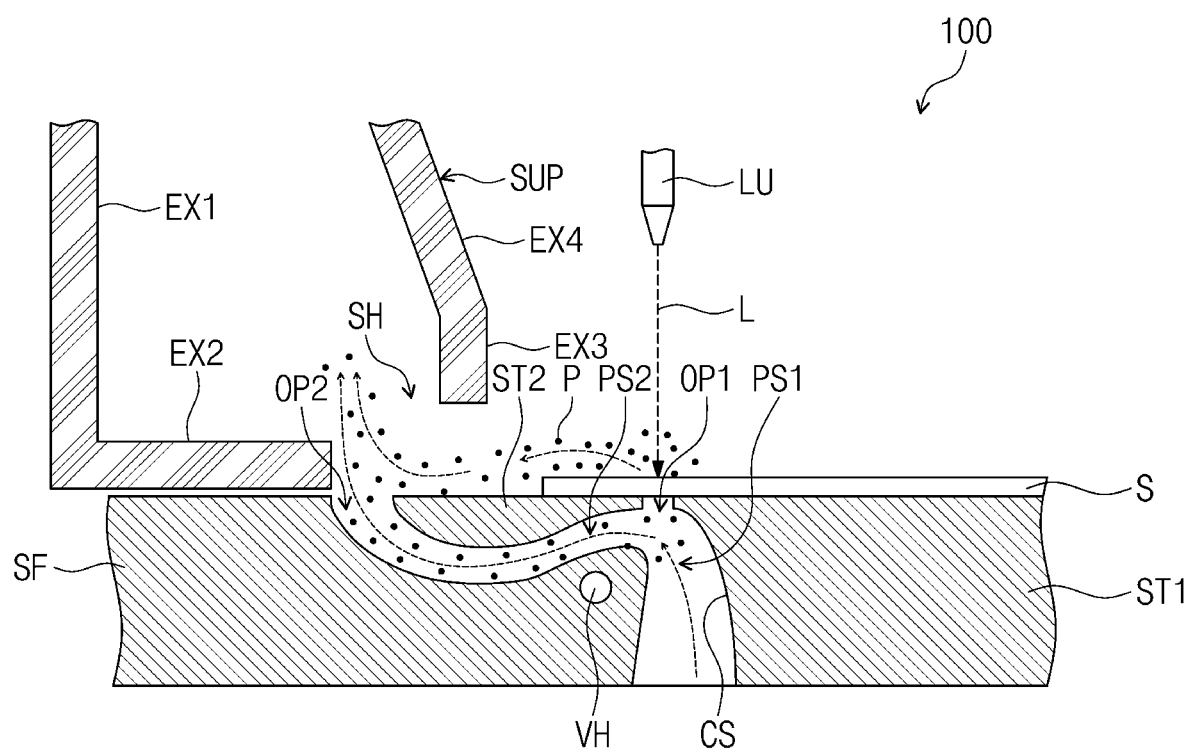

Referring to FIG. 4, a plurality of fixing units FX may be arranged to affix the second stage ST2 securely to the support frame SF. According to an exemplary embodiment, a plurality of second support units SU2 may be disposed between the second stage ST2 and the support frame SF disposed below the lower surface of the second stage ST2. The fixing units FX may be inserted between second support units SU2. FIGS. 5 and 6 are views for explaining a substrate processing method incorporating the substrate processing apparatus depicted in FIG. 1.

For convenience of description, FIGS. 5 and 6 illustrate a cross-sectional view corresponding to the cross-section of FIG. 2.

Referring to FIG. 5, a first stage ST1, a second stage ST2 at least partially surrounding the first stage, a support frame SF at least partially surrounding the second stage, and a substrate S to be processed that may be disposed across the first stage ST1 and the second stage ST2. The substrate processing apparatus 100 may include a laser unit LU generating laser L. The laser L generated in the laser unit LU irradiates a portion of the substrate S which overlaps a first opening part OP1 between the first stage ST1 and the second stage ST2.

Referring to FIG. 6, the portion of the substrate S, which overlaps the first opening part OP1, may be processed, e.g., cut by the laser L. Contamination particles P generated when the substrate S is cut may be withdrawn to the outside by being suctioned into a suction hole SH formed as a cavity within a suction part SUP. The contamination particles P may be generated at upper and lower surfaces of the substrate S. Since suction force is generated in the suction part SUP, a first air stream flowing from an upper portion of the substrate S to a space between the second stage ST2 and the third extension part EX3 and the suction hole SH may be generated.

The contamination particles P generated on the upper portion of the substrate S may be suctioned from the upper surface of the substrate S to the space defined between an upper surface of the second stage ST2 and the third extension part EX3 through a first air stream. The first air stream travels into the suction hole SH of the section part SUP. Since the space between the third extension part EX3 and the upper surface of the second stage ST2 is greater than the space which exists between the second extension part EX2 and the upper surface of the support frame SF, the contamination particles may more readily flow to the suction hole SH through the space between the third extension part EX3 and the upper surface of the second stage ST2.

Since the suction force is generated in the suction part SUP, a second air stream flowing across a first passage PS1, a first opening part OP1, a second passage PS2, a second opening OP2, and the suction hole SH may be generated. The contamination particles P generated from the lower surface of the substrate S may move through the first passage PS1, the first opening OP1 as well as across the second passage PS2, and the second opening OP2 through the second air stream and may then be suctioned into the suction hole SH of the suction part SUP.

Since the first stage ST1 has one side having a curved shape, the first air stream may more easily flow through the first passage PS1. The first air stream and the second air stream are both generated toward one suction part SUP. For example, the first air stream and the second air stream may be generated towards the suction hole SH in substantially the DR3 direction.

A lower suction part may be additionally disposed on the support part SP to suction the contamination particles P generated from the lower portion of the substrate S iii addition to the upper suction part SUP. However, a space for installing the lower suction part entails an additional cost. In addition, the upper suction part SUP may generate an air stream in an upward direction, and the lower suction part may generate an air stream in an opposite downward direction.

Since the air stream flowing upward and the air stream flowing downward oppose one another, a space in which the upstream flow rate and the downstream flow rate are offset may be provided. The contamination particles P may therefore become suspended by the opposing suction forces offsetting one another without being suctioned into either the upper and lower suction parts.

The floating contamination particles P may be accumulated in a pipe connected to the lower suction part after the substrate processing process is completed. The pipe connected to the lower suction part may become blocked by the contamination particles when this technique is employed. In this case, the contamination particles may flow backward and be adsorbed onto the lower portion of the substrate S, thus contaminating it.

However, in an exemplary embodiment of the present inventive concept, the contamination particles generated from the upper and lower surfaces of the substrate S may be suctioned into a single suction part SUP through the first and second air streams, which are generated in substantially the same direction, thus the contamination of the substrate S may be prevented.

As a result, the substrate processing apparatus 100, according to an exemplary embodiment of the inventive concept, may effectively remove the contamination particles generated from the upper and lower surfaces of the substrate S to prevent contamination.

The space above the upper surface of substrate S may be greater than the space within the first passage PS1 and the first opening OP1, and the second passage PS2 and the second opening part OP2. The contamination particles generated from the lower surface of the substrate S may be more readily suctioned relative to the upper surface contamination particles due to the decreased space. Furthermore, the pressure on a lower surface of the substrate S may also be less than the pressure experienced on an upper surface of the substrate S at the opening part OP1.

Thus, when the contamination particles P are suctioned into the suction part, a predetermined pressure may be applied at the upper surface of the substrate S relative to the lower surface of the substrate S. As a result, the substrate S may be firmly affixed to the upper surfaces of the first and second stages ST1 and ST2.

Figure 7:
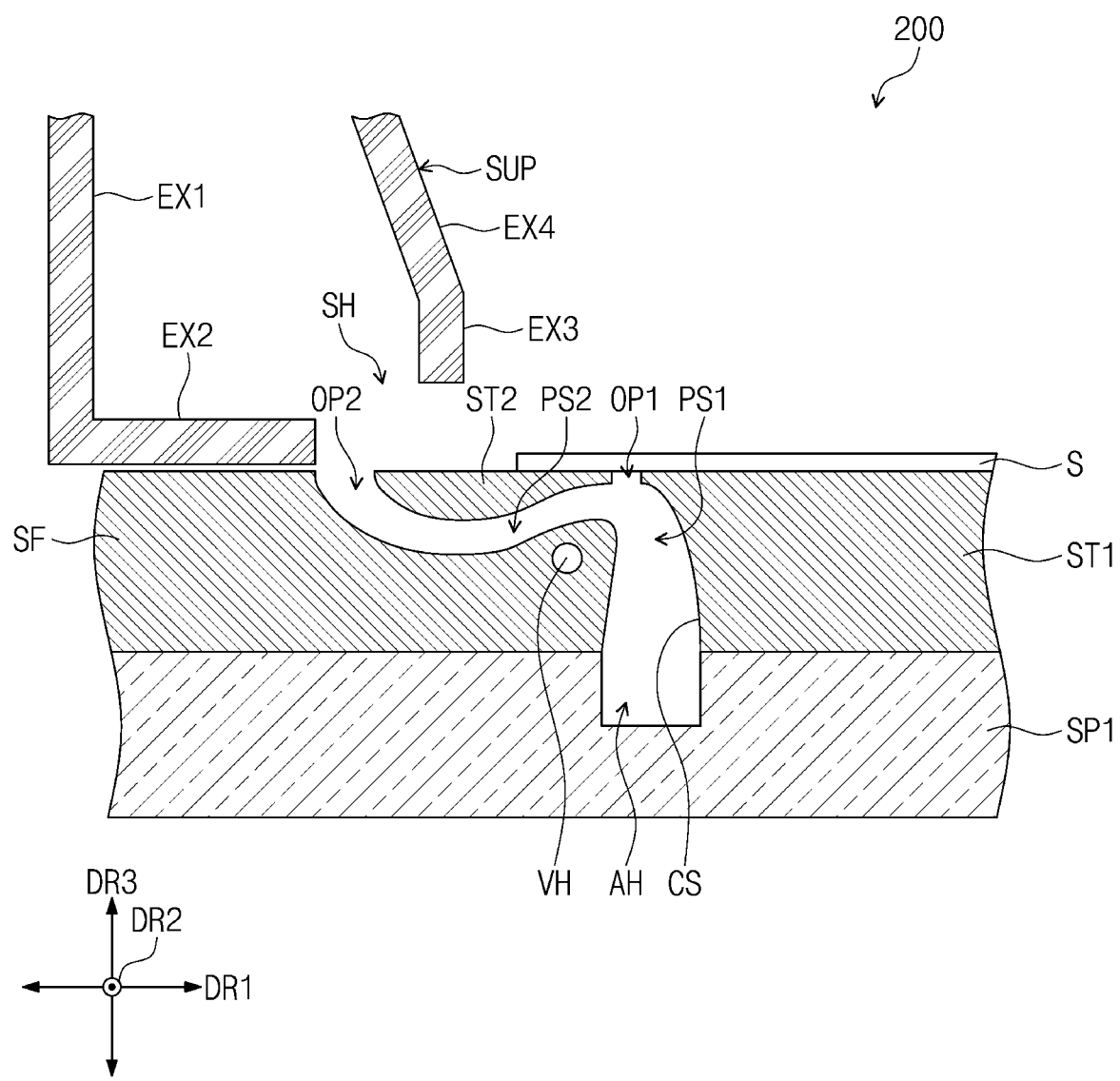
FIG. 7 is a view illustrating a substrate processing apparatus according to an exemplary embodiment of the inventive concept.

FIG. 7 is a view of a substrate processing apparatus according to an exemplary embodiment of the inventive concept.

FIG. 7 illustrates a cross-sectional view corresponding to the cross-section illustrated in FIG. 2. The substrate processing apparatus 200 of FIG. 7 may have the same structure as the substrate processing apparatus 100 of FIG. 2 except for an additional support part SP1 component. Thus, exemplary embodiments of the substrate processing apparatus 200, which are different from those of the substrate processing apparatus of FIG. 2, will be described below. Referring to FIG. 7, a support part SP1 may be disposed on lower portions of a first stage ST1 and a support frame SF, and the support part SP1 may support the first stage ST1 and the support frame SF. An air injection hole AH may be defined in the support part SP1 and may integrate with a first passage. Although not shown, the air injection hole AH may be connected to an external air injection device to help encourage the airstream of suctioned air towards the suction part SUP and suction hole SH.

The air injection hole AH may overlap, a first passage PS1. The air injection hole AH may be connected to the first passage PS1. Air may be injected into the air injection hole AH through an air injection device. Thus, the air may be provided to the first passage PS1 through the air injection hole AH. In this case, air flowing upwardly through the air injection hole AH, the first passage PS1, a first opening part OP1, a second passage PS2, and a second opening OP2 may be generated. A stronger air stream may flow from the assistance of the air injection hole AH applying an upward force in substantially the same direction as the suction force applied by the suction part SUP (substantially in the third direction DR3). Thus, the contamination particles may be more easily removed by being suctioned into the suction part SUP.

Figure 8:
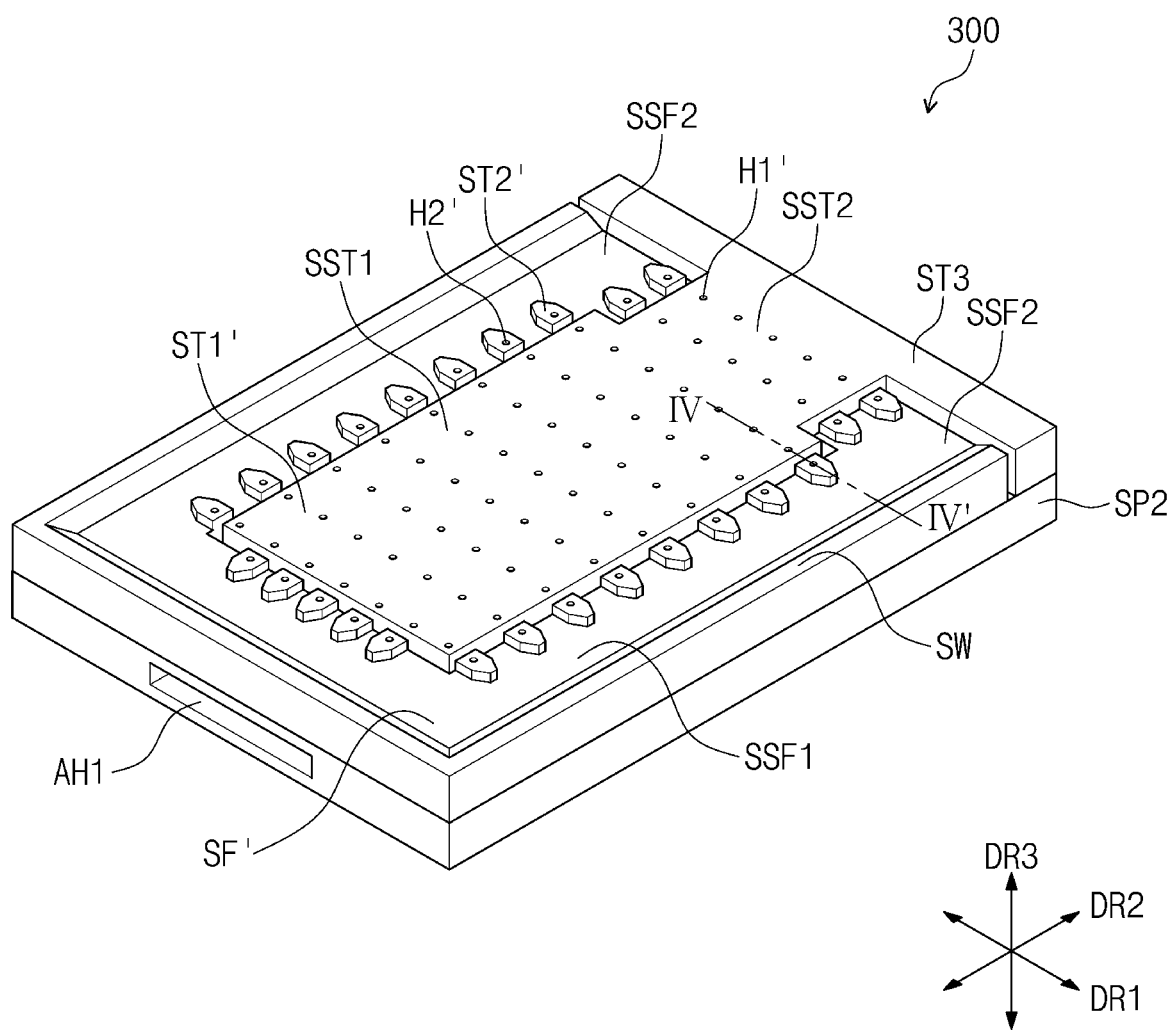
FIG. 8 is a view illustrating a substrate processing apparatus according to an exemplary embodiment of the inventive concept.

FIG. 8 is a perspective view illustrating a substrate processing apparatus according to an exemplary embodiment of the inventive concept.

For convenience of description, a suction part SUP is omitted in FIG. 8.

Referring to FIG. 8, a substrate processing apparatus 300 may include a first stage ST1', a plurality of separately spaced second stages ST2', a support frame SF', a sidewall SW, a third stage ST3, and a support part SP2.

The support frame SF' may at least partially surround the first stage ST1' with a gap there between defining an opening part. The second stages ST2' may be spaced apart from one another and disposed on an upper surface of the support frame SF' on a side nearest the opening part.

A top surface of the support frame SF' may be disposed at a height lower than that of both the first stage ST1' and the second stages ST2'. The top surface of each of the second stages ST2' may be disposed at the same height as the top surface of the first stage ST1'.

The first stage ST1' may include a rectangular first sub-stage SST1 and a rectangular second sub-stage SST2 having a planar area less than that of the first sub-stage SST1. The first sub-stage SST1 may have short sides extending in a first direction DR1 and long sides extending in a second direction DR2.

The first sub-stage SST1 may be contiguous with the second sub-stage SST2 at one short side. The second sub-stage SST2 may be contiguous with the first at one short side of the first sub-stage. The second sub-stage SST2 may have a width narrower than that of the first sub-stage SST1 in the first direction DR1.

The support frame SF' may include a first sub-support frame SSF1 and second sub-support frames SSF2. The first sub-support frame SSF1 may at least partially surround the long sides of the first sub-stage SST1 and at least partially surround a side of the first sub-stage SST1 which is opposite to the one side of the first sub-stage SST1 contiguous with sub-stage SST2. The second sub-support frames SSF2 may extend from the first sub-support frame SSF1 and at least partially surround the second sub-stage SST2.

The third stage ST3 may be disposed to face the first sorb stage SST1 with the second sub stage SST2 there between. The third stage ST3 may be contiguous with the first stage ST1'. The sidewall SW may be integrated with the support frame SF'. For example, the sidewall SW may at least partially surround outsides of the first and second sub-support frames SSF1 and SSF2, and may be connected to the first and second support frames SSF1 and SSF2.

The third stage ST3 may have a length greater than that of the first sub-stage SST1 in the first direction DR1. A top surface of the sidewall SW may be disposed at a height greater than that of both the first and second sub-support frames SSF1 and SSF2.

The support part SP2 may be disposed on lower surfaces of the first stage ST1' and the support frame SF'. A first air injection hole AH1 may be defined in an upper surface of the support part SP2. A plurality of first holes H1' may be defined in the first stage ST1', and at least one second hole H2' may be defined in each of the second stages ST2'. The first and second holes H1' and H2' may have substantially the same function as the first and second holes H1 and H2 of FIG. 1. The second holes H2' may be disposed adjacent to sides of the second stages ST2', which face the first stage ST1'.

Figure 9:
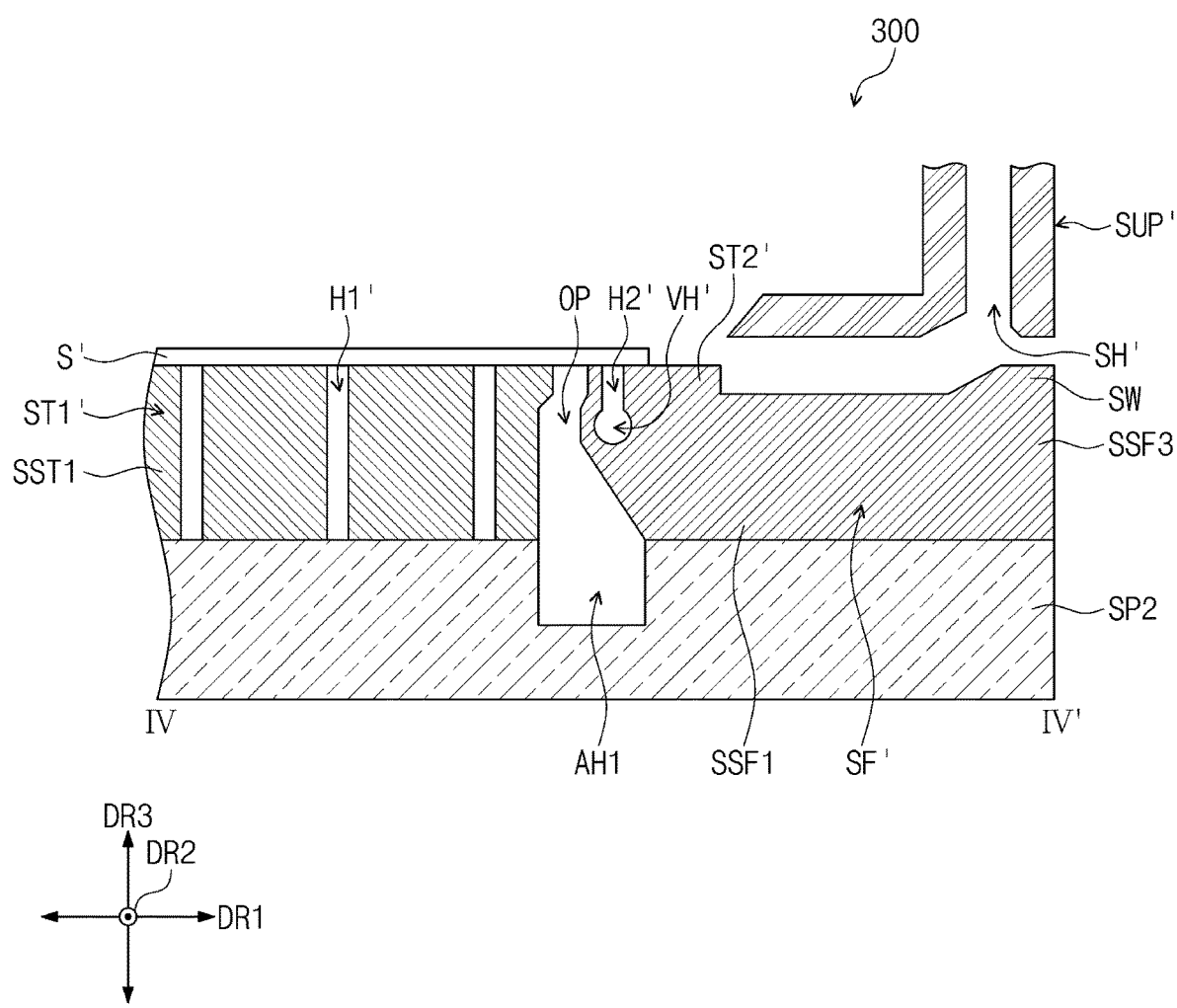
FIG. 9 is a cross-sectional view taken along line IV-IV' of FIG. 8.

FIG. 9 is a cross-sectional view taken along line IV-IV' of FIG. 8.

Referring to FIG. 9, the suction part SUP' may be disposed on the support frame SF' and the sidewall SW. The suction part SUP' may be disposed adjacent to the second stages ST2'. A suction hole SH' may be defined in a lower portion of the suction part SUP'. The second holes H2' may be connected to a vacuum hole VH' defined in the support frame SF'. The substrate S' may be disposed across the first stage ST1' and the second stage ST2'.

An opening part OP may be defined as an elongated gap between the first stage ST1', and the cumulative height of the support frame SF' with the second stages ST2' disposed thereon. A first air injection hole AH1 may be defined as a cavity in the support part SP'. The first air injection hole AH1 may be connected to the opening part OP to overlap the opening part OP. Substantially, the first air injection hole AH1 illustrated in FIG. 8 may integrate with the opening part OP as illustrated in FIG. 9.

Air provided into the first air injection hole AH1 may be provided to the opening part OP. Thus, an air stream flowing through the first air injection hole AH towards the opening part OP may be generated. The first air injection hole AH may be omitted.

Figure 10:
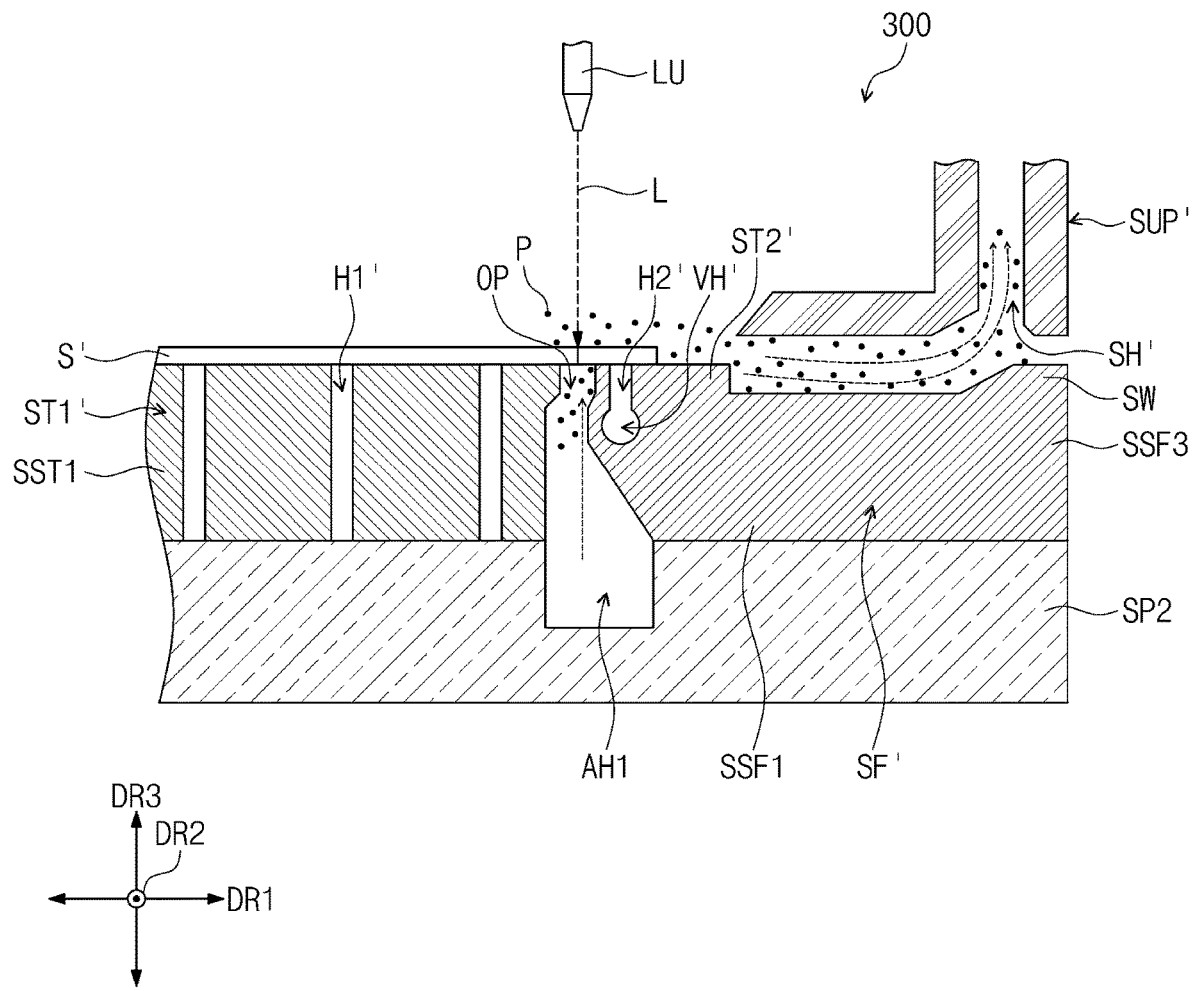
FIGS. 10 and 11 are views illustrating a substrate processing method using the substrate processing apparatuses of FIGS. 8 and 9.
Figure 11:
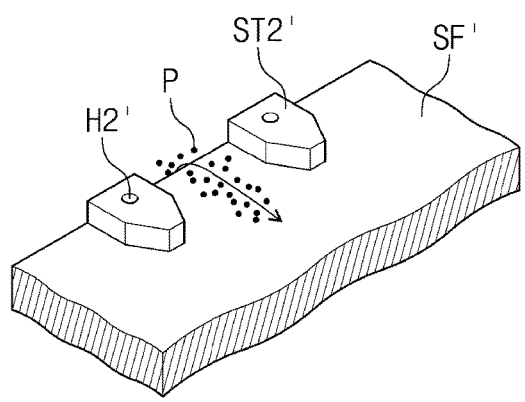
Figure 12:
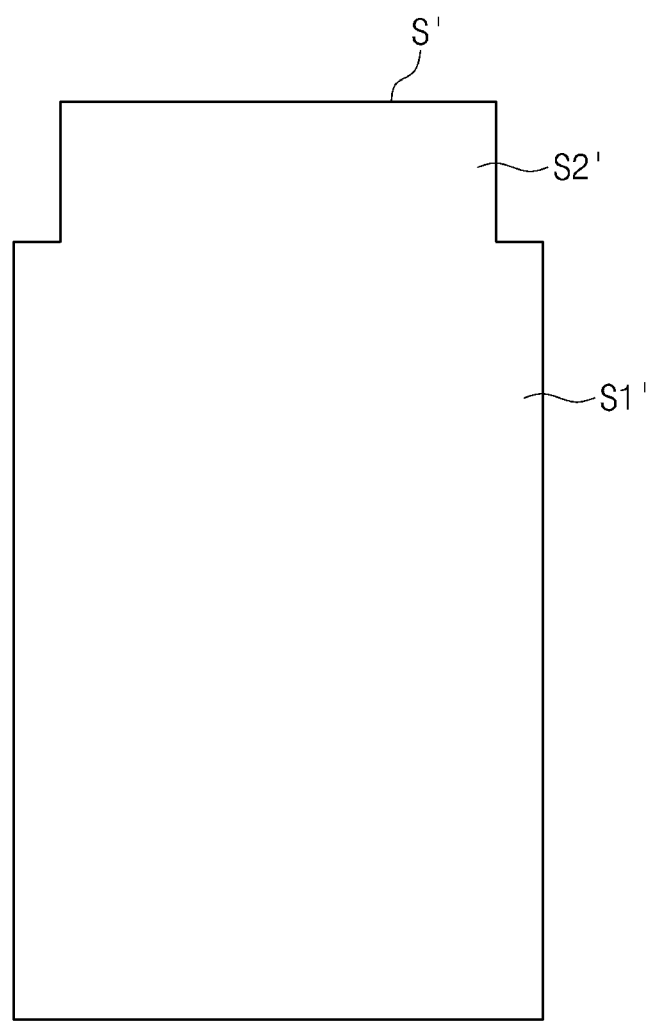
FIG. 12 is a view illustrating a substrate processed by the substrate processing apparatus of FIGS. 10 and 11.

FIGS. 10 and 11 are views illustrating a substrate processing method incorporating an exemplary embodiment of the substrate processing apparatuses of FIGS. 8 and 9. FIG. 12 is a view of a substrate processed by the substrate processing apparatus of FIGS. 10 and 11.

For a more concise description, FIG. 10 illustrates a cross-sectional view corresponding to the cross-section of FIG. 9.

Referring to FIGS. 10 and 11, the substrate S" may be adsorbed and affixed to the first stage ST1' and the second stages ST2' by a vacuum effect created in the first and second holes H1' and H2'. The laser L generated in the laser unit LU may be irradiated onto a portion of the substrate S', which overlaps the first stage ST1' and the second stages ST2'. The portion of the substrate S' overlapping the opening part OP may be cut by the laser L.

Contamination particles P generated when the substrate S' is irradiated may be removed by being suctioned into a suction part SUP. The contamination particles P generated from the upper portion of the substrate S' may be suctioned into the suction hole SH' defined as the space comprising the interior inlet of the suction part SUP'. As illustrated in FIG. 11, the contamination particles P generated at the lower surface of the substrate S' may be suctioned into the suction hole SH' of the suction part SUP' via a space between adjacent second stages ST2' through an air stream flowing from the first air injection hole AH1 and outwardly from the opening part P.

The suction part SUP' may suction the contamination particles P and additionally generate an air stream flowing through the first air injection hole AH1 and the opening part OP. Thus, the contamination particles P generated from the lower surface of the substrate S' may be more efficiently suctioned towards the suction part SUP' into the suction hole SH.

As a result, the substrate processing apparatus 300, according to an embodiment of the inventive concept, may effectively remove the contamination particles generated from the upper and lower portions of the substrate S' thus preventing the substrate S' from becoming contaminated.

The substrate S processed by the substrate processing apparatus 100 of FIG. 1 may have a substantially rectangular shape though the inventive concept is not so limited. However, as illustrated in FIG. 12, the substrate S' processed by the substrate processing apparatus 300 of FIGS. 8 and 9 may include a first portion S1' having a shape corresponding to that of the first sub-stage SST1 and a second portion S2' having a shape corresponding to that of the second sub-stage SST2. For example, a plurality of pixels may be disposed on the first portion S1', and a driving chip for driving the pixels may be disposed on the second portion S2'.

Figure 13:
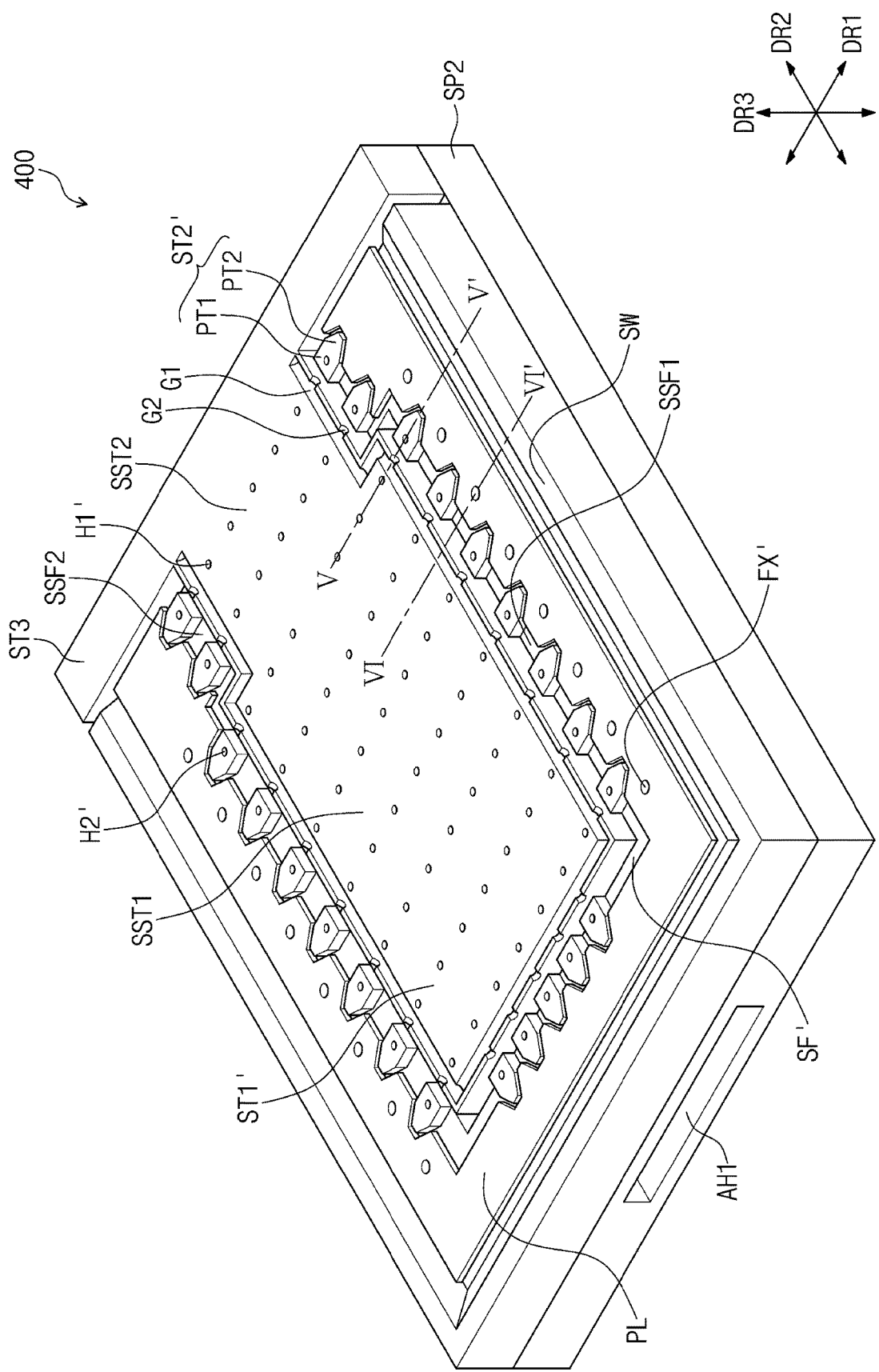
FIG. 13 is a view illustrating a substrate processing apparatus according to an exemplary embodiment of the inventive concept.
Figure 14:
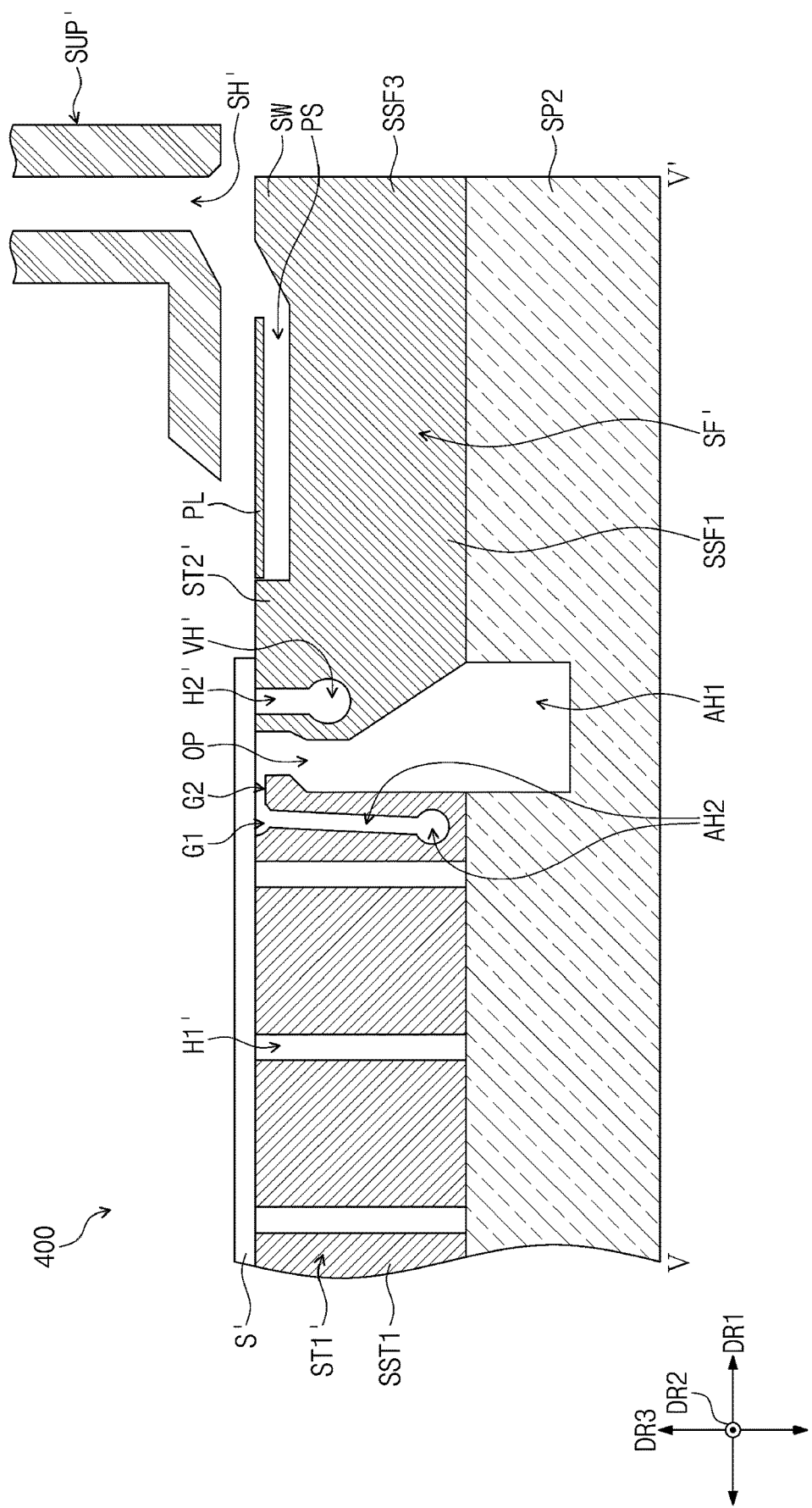
FIG. 14 is a cross-sectional view taken along line V-V' of FIG. 13.
Figure 15:
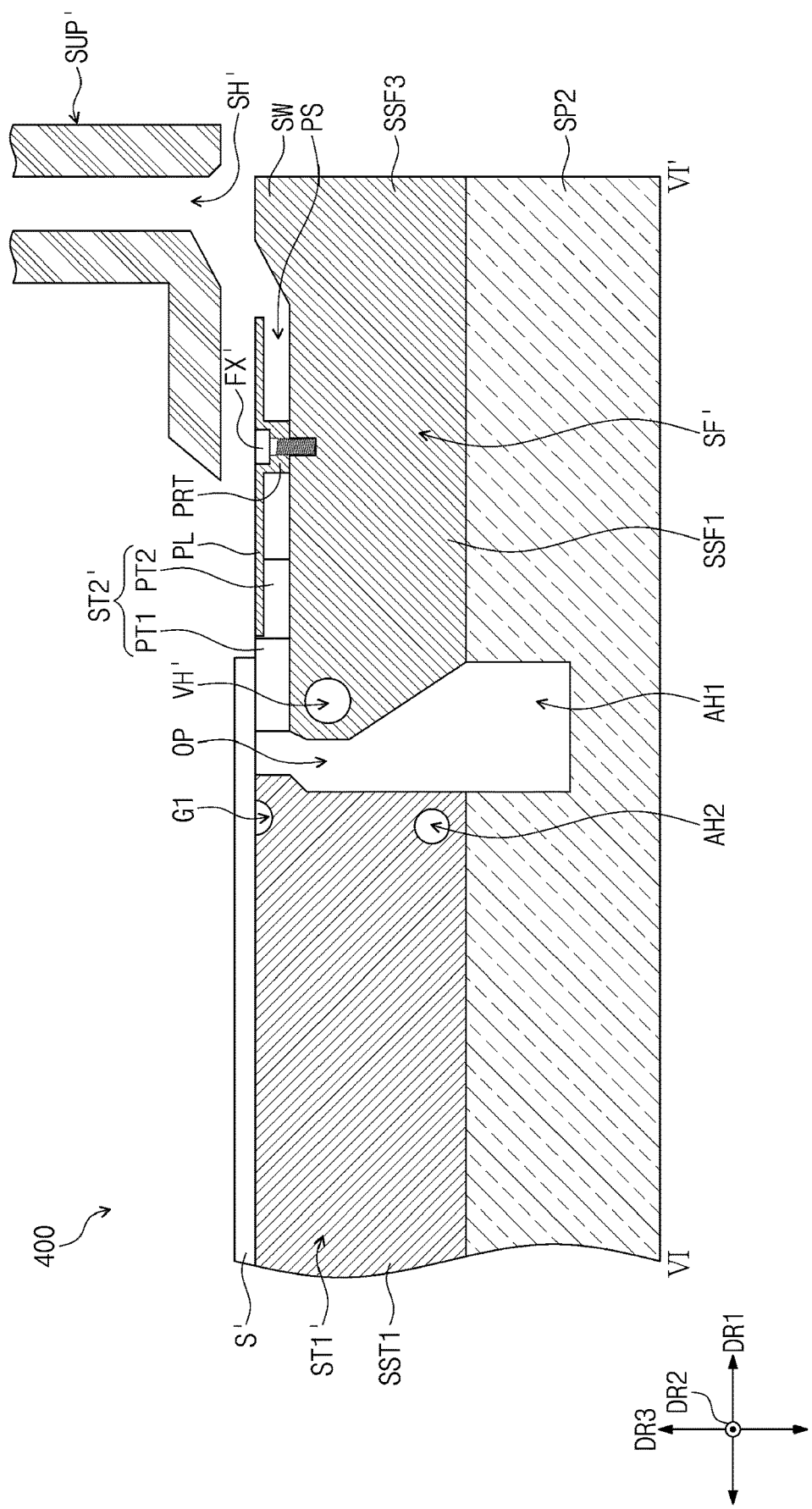
FIG. 15 is a cross-sectional view taken along VI-VI' of FIG. 13.

FIG. 13 is a view of a substrate processing apparatus according to an exemplary embodiment of the inventive concept. FIG. 14 is a cross-sectional view taken along line V-V' of FIG. 13. FIG. 15 is a cross-sectional view taken along line VI-VI' of FIG. 13.

For convenience of description, a suction part SUP' is omitted from FIG. 13. Hereinafter, constituents of the substrate processing apparatus 400 of FIGS. 13 to 15 (which are different from those of the substrate apparatus of FIGS. 8 and 9) will be described below. Referring to FIG. 13, a first groove G1 and a plurality of second grooves G2 may be defined in the upper surface of the first stage ST1'. For example, a first groove may be disposed on the first stage adjacent to the top of the second air injection hole and a plurality of second grooves extending from predetermined portions of the first groove toward the edge of the first stage nearest the border gap. Each of the second stages ST2' may include a first portion PT1 adjacent to the border and disposed on the upper surface of the support frame SF' and a second tapered portion PT2 extending from the first portion PT1 and spaced apart more greatly in the second direction DR2 relative to consecutive PT1 portions are spaced apart from one another. The first portion PT1 may have a rectangular shape, and the second portion PT2 may have a trapezoid shape. The first portion PT1 may have a planar area greater than that of the second portion PT2.

A plate PL may be disposed on the upper surface of the second stage ST2'. The plate PL may at least partially surround the second portion PT2 of the second stage. Fixing units FX' may be disposed on predetermined portions of the plate PL.

Referring to FIGS. 14 and 15, the plate PL may be disposed to be spaced apart in the DR3 direction from the top surface of the support frame SF'. The plate PL may have a height in the third direction DR3 less than that of each of the second stages ST2' in the third direction DR3. Thus, a predetermined passage PS may be defined between the support frame SF' and the plate PL.

The fixing units FX' may be inserted into protrusions PRT protruding downward from the predetermined portions and through the support frame SF' to affix the plate PL to the support frame SF'.

The first groove G1 may be connected to a second air injection hole AH2 defined in a predetermined portion of the first stage ST1' adjacent to the edge of the first stage ST1' nearest the border. The second air injection hole AH2 may further be adjacent to a bottom surface of the first stage ST1' than the top surface of the first stage ST1'. The second air injection hole AH2 may provide air toward the first groove G1. Thus, an air stream flowing through the second air injection hole AH2, the first groove G1, and the second grooves G2 may be generated.

The suction part SUP' may be spaced apart from the second stages ST2' and disposed on the support frame SF' and the sidewall SW. The suction part SUP' may be farther away from a position at which the contamination particles are generated, than the suction part SUP' of FIG. 8. An end of the passage PS may be adjacent to the suction hole SH' of the suction part SUP'.

Figure 16:
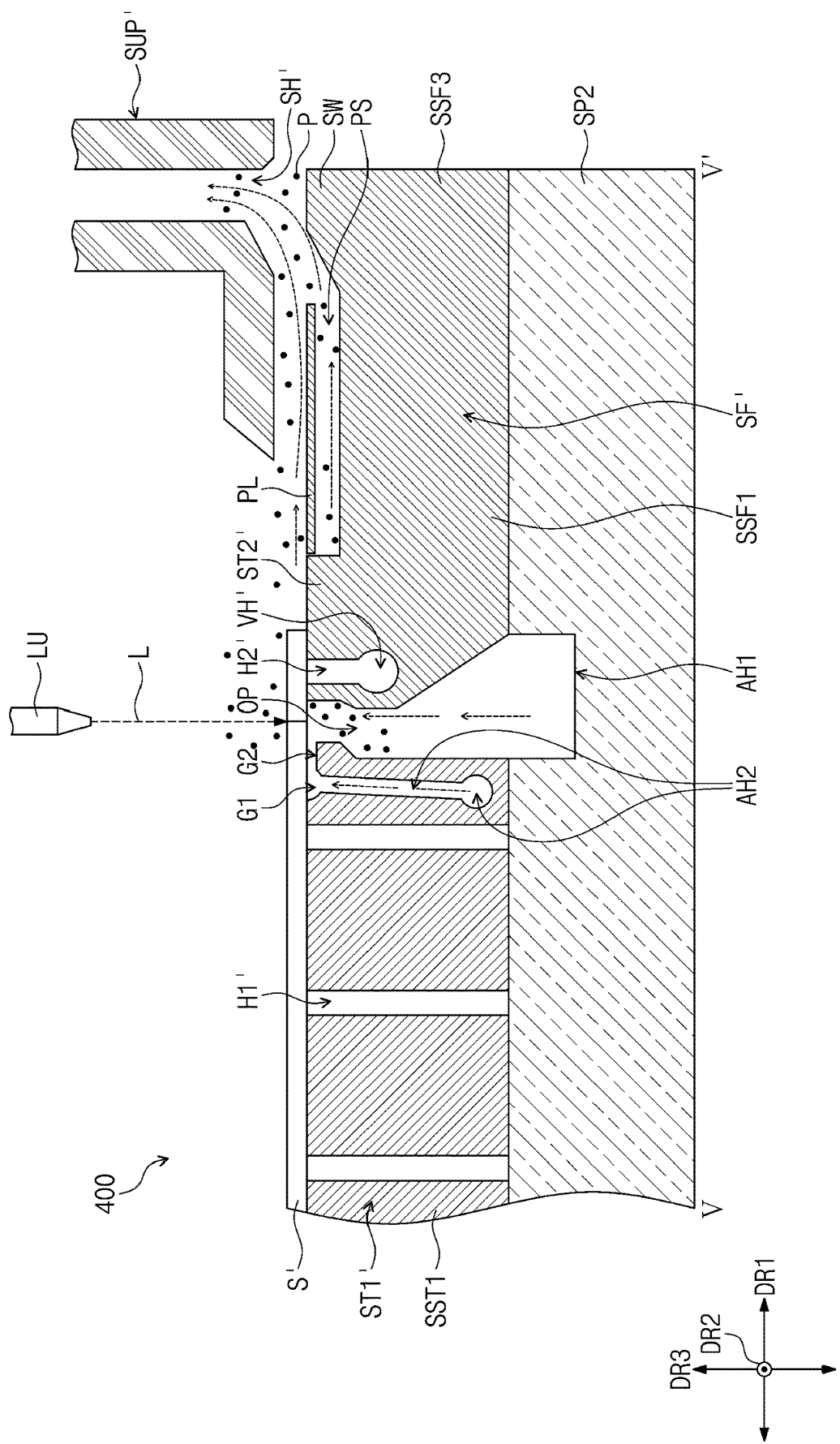
FIGS. 16 and 17 are views illustrating a substrate processing method using the substrate processing apparatus of FIG. 13.
Figure 17:
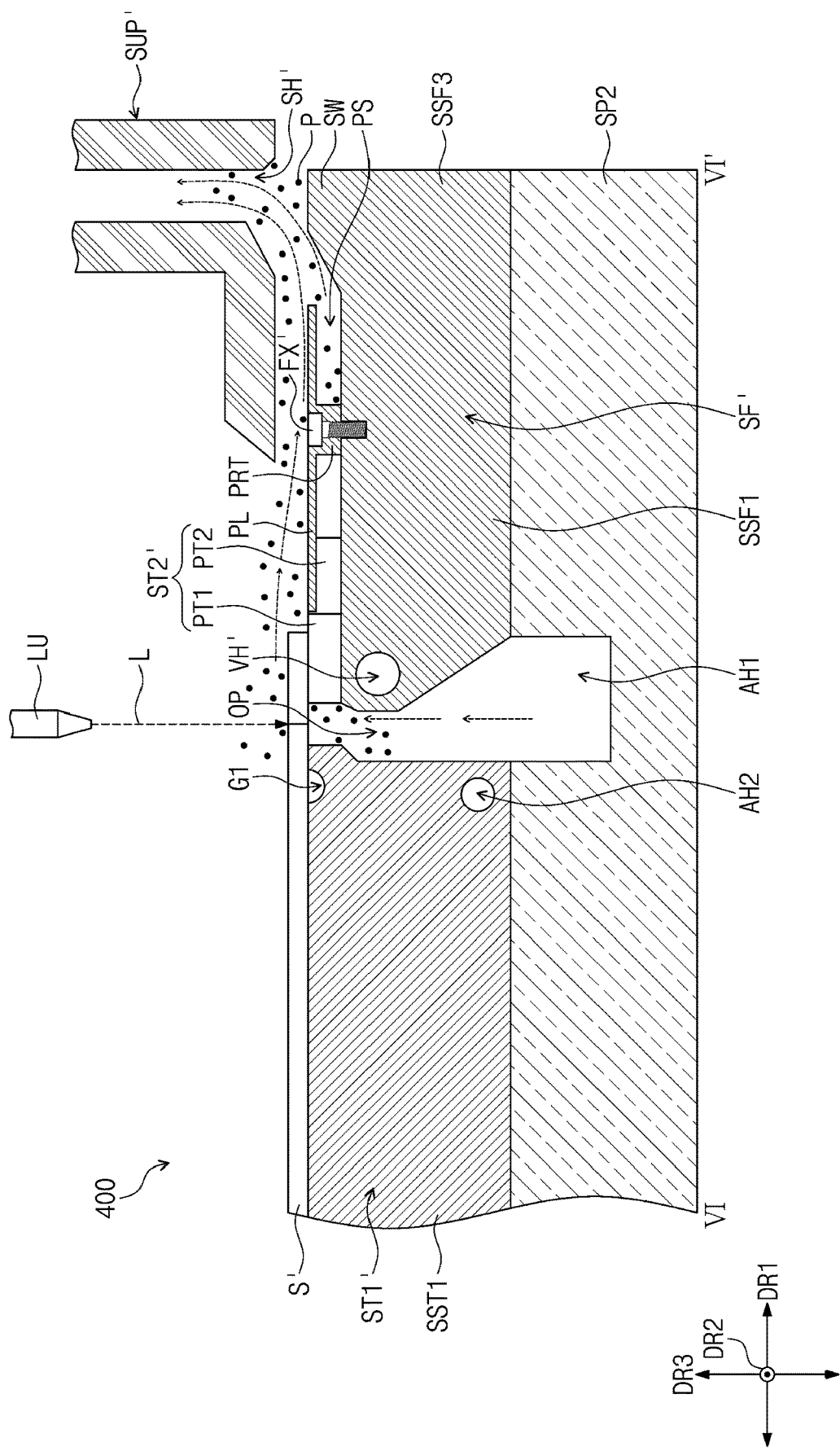

FIGS. 16 and 17 are views for explaining a substrate processing method using the substrate processing apparatus of FIG. 13.

For convenience of description, FIGS. 16 and 17 illustrate cross-sectional views corresponding to the cross-sections of FIGS. 14 and 15.

Referring to FIGS. 16 and 17, the substrate S' may be disposed on the first stage ST1' and the second staves ST2' and affixed to the first stage ST1' and the second stages ST2' by the first and second holes H1' and H2'.

A portion of the substrate S', which overlaps the opening part OP between the first stage ST1' and the second stages ST2' may be irradiated by the laser unit L. The contamination particles P generated when the substrate S' is cut may be removed by being suctioned into the suction hole SH of the suction part SUP'.

The contamination particles P generated from the upper portion of the substrate S' may be suctioned into the suction hole SH' of the suction part SUP'. The contamination particles P generated from the lower surface of the substrate S' may be generated in the passage PS defined in the lower portion of the plate PL via the space between the second stages ST2'. The contamination particles P may be suctioned into the suction hole SH' of the suction part SUP' through the passage PS.

Unlike what is illustrated in FIG. 8, when the suction part SUP' is further spaced apart from the position at which the contamination particles are generated, the contamination particles P may be more efficiently suctioned towards the suction hole SH' of the suction part SUP' through the passage PS defined by the plate PL.

A larger amount of contamination particles P may be generated from the substrate S' at the moment when the laser L is provided to the substrate S'. The contamination particles P may penetrate between the first stage ST1' and the substrate S', thus contaminating the lower portion of the substrate S'.

In an exemplary embodiment of the inventive concept, a first groove G1 and a second groove G2, which are adjacent to the edge of the substrate S', may be defined in the first stage ST1', and an air stream flowing through the second air injection hole AH2, the first groove G1, and the second grooves G2 may be generated. Thus, the contamination particles P may flow to the passage PS through the opening OP without contaminating the substrate S'.

As a result, the substrate processing apparatus 400 according to an exemplary embodiment of the inventive concept may effectively remove the contamination particles generated from the upper and lower surfaces of the substrate S' to prevent the substrate S' from being contaminated.

In the substrate processing apparatus and the substrate processing method, the contamination particles generated on the upper and lower portions of the substrate may be effectively removed to prevent the substrate surfaces from becoming contaminated.

It will be apparent to those skilled in the art that various modifications and variations can be made in the inventive concept. Thus, to the maximum extent allowed by law, the scope of the present invention is to be determined by the broadest permissible interpretation of the following claims and their equivalents, and shall not be restricted or limited by the foregoing detailed description.

What is claimed is:
1. A substrate processing apparatus, comprising:
a first stage;
a support frame disposed on the first stage;

a plurality of island-type second stages disposed on the support frame; and
a suction part disposed on the support frame,
wherein a top surface of the support frame lower than a top surface of the first stage, and
wherein a top surface of each of the plurality of island-type second stages is disposed on a same plane as the first stage.

2. The substrate processing apparatus of claim 1, wherein the first stage comprises:
a first sub stage having a rectangular shape having a pair of short sides extending primarily in a first direction and a pair of long sides extending primarily in a second direction crossing the first direction; and
a second sub stage having a planar area that is smaller than a planar area of the first sub stage, the second sub stage extending from one side of the first sub stage, in the second direction, and the second sub stage having a width, in the first direction, that is less than that of the first sub stage.

3. The substrate processing apparatus of claim 2, further comprising a third stage,
wherein the second sub stage is disposed between the first sub stage and the third stage, and
wherein the third stage as a length, in the first direction, that is greater than that of the first sub stage.

4. The substrate processing apparatus of claim 2, wherein the support frame comprises:
a first sub support frame at least partially surrounding the pair of long sides of the first sub stage; and
a second sub support frame adjacent to the second sub stage, the second sub support frame extending from the first sub support frame.

5. The substrate processing apparatus of claim 4, further comprising a sidewall least partially surrounding the first and second sub support frames and connected to the first and second support frames.

6. The substrate processing apparatus of claim 5, wherein the sidewall has a top surface that is disposed higher than that of each of the first and second support frames.

7. The substrate processing apparatus of claim 1, further comprising a laser unit configured to generate a laser beam between the first stage and the plurality of island-type second stages so as to process the substrate disposed on the first stage and the plurality of island-type second stages.

8. The substrate processing apparatus of claim 7, further comprising a support part which is disposed below the first stage and the support frame and in which a first air injection hole overlapping an opening part defined between the first stage and the support frame and between the first stage and the plurality of island-type second stages is defined.

9. The substrate processing apparatus of claim 8, wherein, a suction hole of the suction part is configured to suction out contamination particles generated from the processing of the substrate, and
wherein the suction part is further configured to generate an air stream flowing through the first air injection hole and the opening part.

10. The substrate processing apparatus of claim 9, wherein a space between the plurality of island-type second stages, through the air stream, is configured to suction contamination particles generated from a lower portion of the substrate into the suction hole.

11. The substrate processing apparatus of claim 1, wherein a plurality of first holes configured to provide predetermined adsorption force are defined in the first stage, and a plurality of second holes configured to provide predetermined adsorption force are defined in the plurality of island-type second stages, and
wherein the plurality of second holes are adjacent to the plurality of island-type second stages.

12. The substrate processing apparatus of claim 1, further comprising a plate disposed on the support frame,
wherein a predetermined passage is defined between the support frame and the plate.

13. The substrate processing apparatus of claim 12, Wherein each of the plurality of island-type second stages comprises:
a first portion adjacent to the support frame; and
a second portion extending from the first portion and spaced apart from the support frame by a length that is greater than a length of the first portion,
wherein the plate at least partially surrounds the second portion and has a thickness less than that of each of the plurality of island-type second stages in a direction that is perpendicular to the top surface of the first stage.

14. The substrate processing apparatus of claim 1, wherein a first groove adjacent to an edge of the first stage and extending along the edge of the first stage and a plurality of second grooves extending from predetermined portions of the first groove toward the edge of the first stage are defined in the top surface of the first stage, and
wherein the first groove is connected to a second injection hole defined in a predetermined portion of the first stage, which is adjacent to the edge of the first stage.

15. A substrate processing apparatus comprising:
a first stage;
a second stage at least partially surrounding the first stage;
a support frame at least partially surrounding the second stage and extending towards a lower side of the second stage; and
a suction part disposed on both the second stage and the support frame,
wherein a first opening part defined between the first stage and the second stage, a first passage defined between one side of the support frame disposed below the second stage and one side of the first stage facing the one side of the support frame, a second passage defined between the second stage and the support frame disposed below the second stage, and a second opening part defined between the second stage and the support flame surrounding the second stage all define a single integrated space.

16. The substrate processing apparatus of claim 15, wherein the one side of the first stage has a substantially curved shape that is recessed toward the inside of the first stage, a top surface of the support frame disposed below the second stage has a shape that is recessed downward, and a bottom surface of the second stage has a shape that protrudes downward.

17. The substrate processing apparatus of claim 15, further comprising a laser unit configured to generate a laser beam for processing a substrate disposed on the first stage and the second stage,
wherein the laser unit is configured to direct the laser beam to a portion of the substrate which overlaps the first opening part, and the substrate processing apparatus is configured that when suction force is generated in the suction part, a first air stream flowing from an upper portion of the substrate to a suction hole is generated, and a second air stream flowing to the first passage, the first opening part, the second passage, the second opening part, and the suction hole is generated, wherein the substrate processing apparatus is further configured such that contamination particles generated from an upper portion of the substrate are suctioned into the suction hole through the first air stream, and contamination particles generated from a lower portion of the substrate are suctioned into the suction hole through the second air stream, and wherein the substrate processing, apparatus is further configured such that in the first opening part, a pressure of a lower side of the substrate is less than that of an upper side of the substrate.

18. The substrate processing apparatus of claim 17, wherein the section part comprises:

a first extension part disposed on the support frame, the first extension part extending primarily in a direction perpendicular to a top surface of the support frame;

a second extension part extending from a lower end of the first extension part in parallel to the top surface of the support frame;

a third extension part disposed on the second stage, defining the suction hole together with the second extension part, and extending in the direction perpendicular to the top surface of the support frame; and a fourth extension part extending from an upper end of the third extension part at a predetermined angle with respect to an upward direction, wherein a lower end of the third extension part is disposed higher than the second extension part, and a space between the third extension part and the second stage is greater than that between the second extension part and the support frame disposed below the second extension part, and wherein the first air stream is generated through the upper side of the substrate, a space between the second stage and the third extension part, and the suction hole.

19. The substrate processing apparatus of claim 15, further comprising a support part which is disposed below the first stage and the support frame and in which an air injection hole overlapping the first passage is defined, wherein an air stream flowing through the air injection hole, the first passage, the first opening part, the second passage, and the second opening part is generated.

20. A substrate processing method comprising:

preparing a support frame at least partially surrounding a first stage, a second stage at least partially surrounding the first stage, and the second stage and extending to a lower side of the second stage;

disposing a substrate on the first stage and the second stage;

directing a laser beam onto a portion of the substrate, which overlaps a space between the first stage and the second stage; and suctioning contamination particles generated from the substrate to a suction part disposed on the second stage and the support frame, wherein the contamination particles generated from a lower portion of the substrate are suctioned into a suction hole of the suction part via a first passage defined between one side of the support frame disposed below the second stage and one side of the first stage, which faces the one side of the support frame, a first opening part defined between the first stage and the second stage, a second passage defined between the second stage and the support frame disposed below the second stage, and a second opening part defined between the second stage and the support frame surrounding the second stage, and wherein the suction hole is adjacent to the second opening part, the one side of the first stage has a substantially curved shape that is recessed to the inside of the first stage, and when the contamination particles are suctioned into the suction part, a pressure of a lower side of the substrate is less than that of an upper side of the substrate in the first opening part.

* * * * *